United States Patent
Holmes et al.

(10) Patent No.: US 11,942,903 B1
(45) Date of Patent: Mar. 26, 2024

(54) MONOLITHIC DIFFERENTIAL PAIR THERMOCOUPLE AMPLIFIER

(71) Applicants: James A. Holmes, Fayetteville, AR (US); A. Matthew Francis, Elkins, AR (US)

(72) Inventors: James A. Holmes, Fayetteville, AR (US); A. Matthew Francis, Elkins, AR (US)

( * ) Notice: Subject to any disclaimer, the term of this patent is extended or adjusted under 35 U.S.C. 154(b) by 621 days.

(21) Appl. No.: 17/130,365

(22) Filed: Dec. 22, 2020

Related U.S. Application Data

(60) Provisional application No. 62/953,324, filed on Dec. 24, 2019.

(51) Int. Cl.
| | |
|---|---|
| *H03F 3/195* | (2006.01) |
| *H01L 27/082* | (2006.01) |
| *H01L 29/16* | (2006.01) |
| *H03F 1/30* | (2006.01) |
| *H03F 3/45* | (2006.01) |
| *H10N 10/17* | (2023.01) |

(52) U.S. Cl.
CPC ........... *H03F 1/302* (2013.01); *H01L 27/082* (2013.01); *H01L 29/1608* (2013.01); *H03F 3/4508* (2013.01); *H10N 10/17* (2023.02); *H03F 2200/447* (2013.01)

(58) Field of Classification Search
CPC .................................. H03F 3/45; H03F 3/195
USPC .................................................. 330/252, 307
See application file for complete search history.

(56) References Cited

U.S. PATENT DOCUMENTS

| | | | | |
|---|---|---|---|---|
| 4,538,899 | A * | 9/1985 | Landa | G03G 15/107 422/4 |
| 5,994,923 | A | 11/1999 | Navabi | 326/89 |
| 6,380,801 | B1 | 4/2002 | McCartney | 330/9 |
| 7,334,471 | B2 * | 2/2008 | Maatuk | G01F 23/246 73/304 R |

* cited by examiner

*Primary Examiner* — Henry Choe
(74) *Attorney, Agent, or Firm* — Keisling & Pieper PLC; David B. Pieper; Trent C. Keisling

(57) ABSTRACT

Two Silicon Carbide negative positive negative transistors realized on a monolithic substrate as a differential pair to keep their base-emitter junctions at nearly the same temperature such that their kT/q sensitivities tract together with their base connections electrically connected to the cold junction terminals of a thermocouple to create an amplified differential voltage across output load resistors while operating at high temperature.

8 Claims, 8 Drawing Sheets

(2) RMCF0201 10 MΩ Ceramic Surface Mount Resistor (1.00mm x 0.50mm)

(3.20mm x 2.50mm)

US 11,942,903 B1

MONOLITHIC DIFFERENTIAL PAIR THERMOCOUPLE AMPLIFIER

CROSS-REFERENCE TO RELATED APPLICATIONS

Not Applicable.

STATEMENT REGARDING FEDERALLY SPONSORED RESEARCH OR DEVELOPMENT

Not Applicable.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in high temperature operation and monitoring of thermocouples and amplifiers. More particularly, the invention relates to improvements particularly suited for amplifier operation in environments above two hundred and fifty degrees Celcius by providing a differential pair amplifier on a single monolithic substrate coupled to a thermocouple.

2. Description of the Known Art

As will be appreciated by those skilled in the art, electrical circuits are known in various forms. Patents disclosing information relevant to amplifiers problems or monolithic substrates include: U.S. Pat. No. 6,380,801, issued to McCartney on Apr. 30, 2002 entitled Operational amplifier; and U.S. Pat. No. 5,994,923, issued to Navabi on Nov. 30, 1999 entitled Correctable output driver and method of using the same. Each of these patents is hereby expressly incorporated by reference in their entirety.

From these prior references it may be seen that these prior art patents are very limited in their teaching and utilization, and an improved monolithic substrate differential pair thermocouple amplifier is needed to overcome these limitations.

SUMMARY OF THE INVENTION

The present invention is directed to an improved monolithic substrate differential pair thermocouple amplifier using two Silicon Carbide (SiC) negative positive negative (NPN) transistors realized monolithically as a differential pair to keep their base-emitter junctions at nearly the same temperature so that their kT/q sensitivities tract together with the base connections tied to the positive and negative terminals of a thermocouple cold junction TC_CJ. Because the gain of the transistors is so high, even very small thermal power (V and I) generated by the thermocouple (hot junction) create differential base currents that are then amplified to the collector currents creating a differential voltage across the output load resistors. Using SiC allows the amplifier to operate at high temperature, reducing the cable length between the cold junction and the hot junctions, thereby improving noise immunity.

These and other objects and advantages of the present invention, along with features of novelty appurtenant thereto, will appear or become apparent by reviewing the following detailed description of the invention.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views.

DETAILED DESCRIPTION OF THE INVENTION

Figure 1:
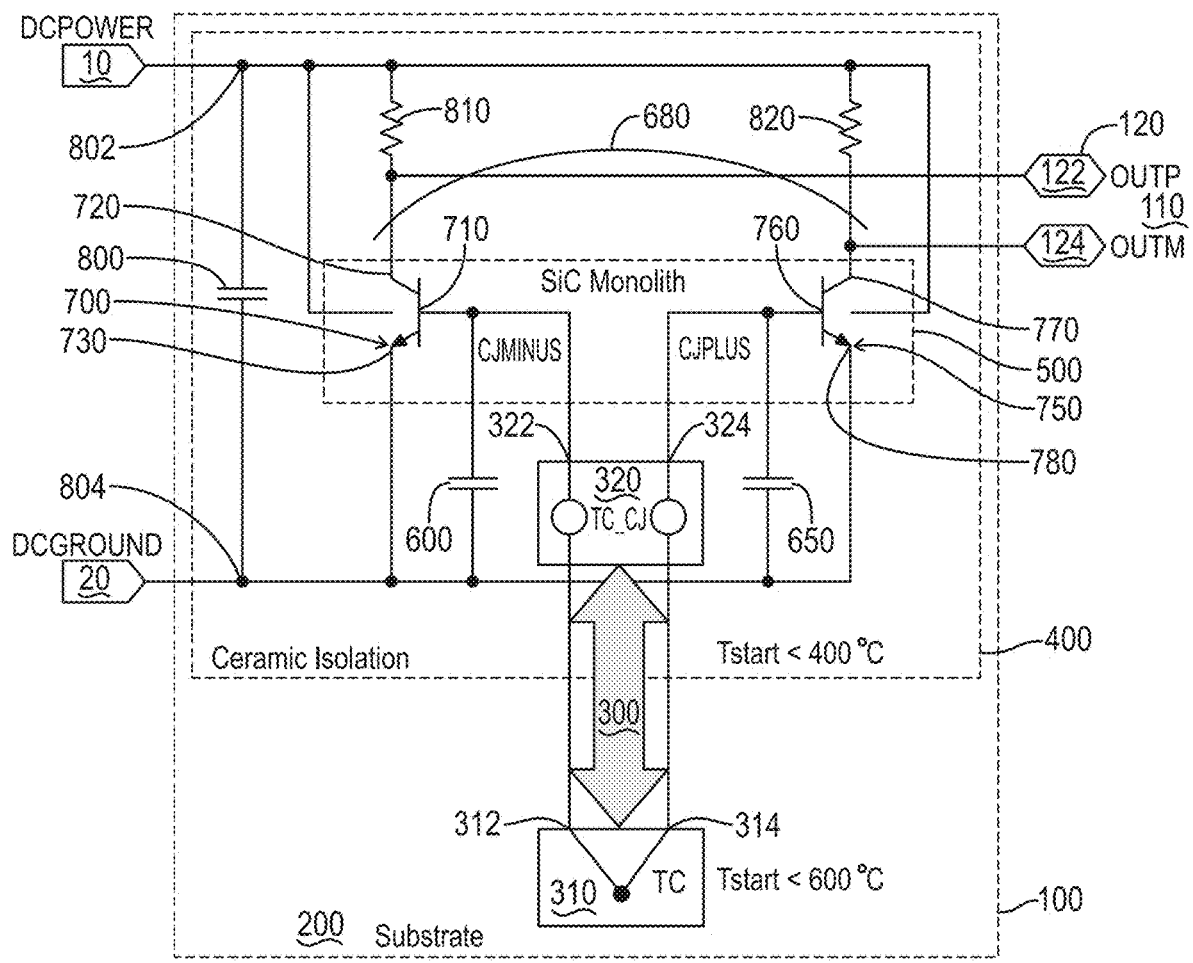
FIG. 1 is a schematic view of a monolithic substrate differential pair thermocouple amplifier.
Figure 2:
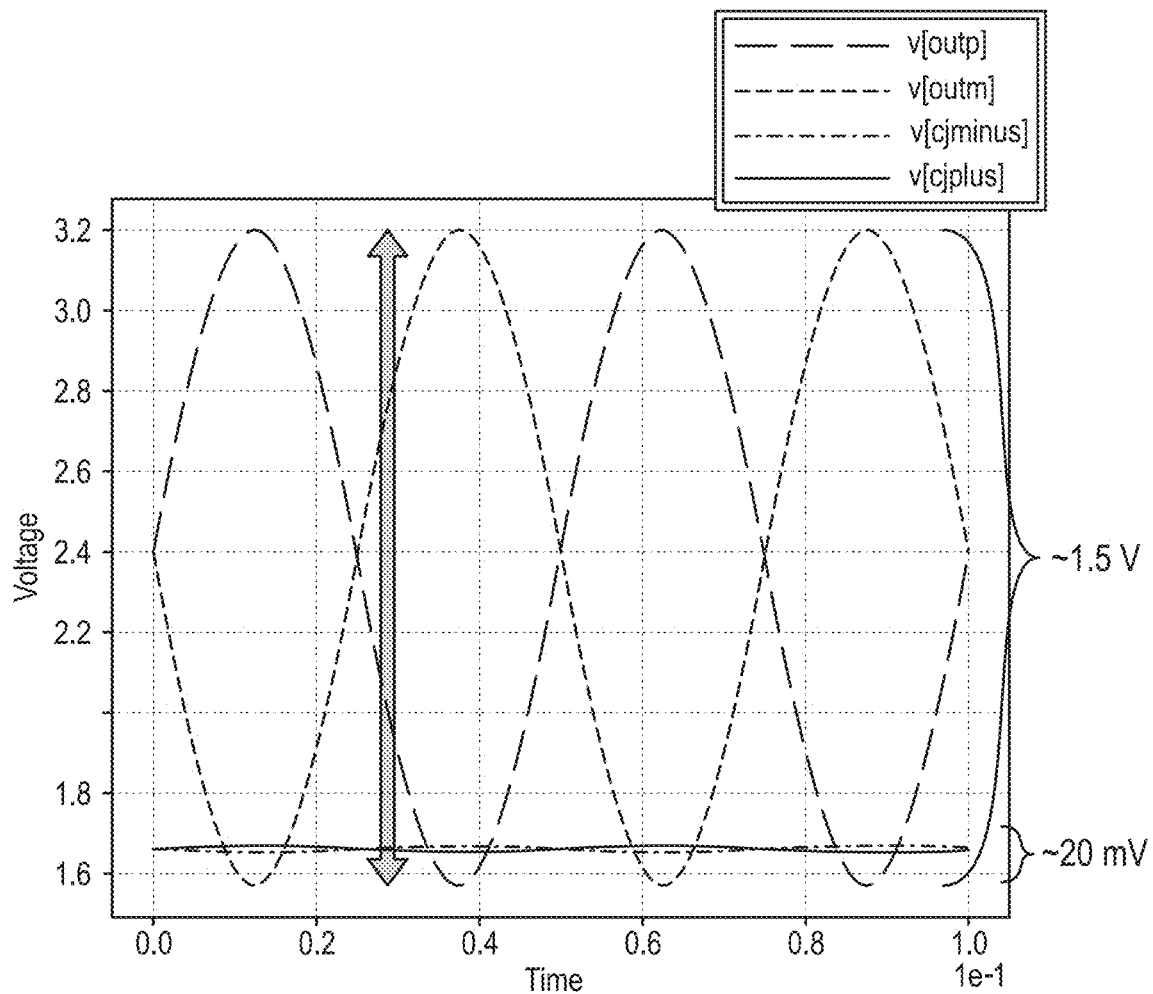
FIG. 2 provides a graph of the voltage time output.
Figure 3:
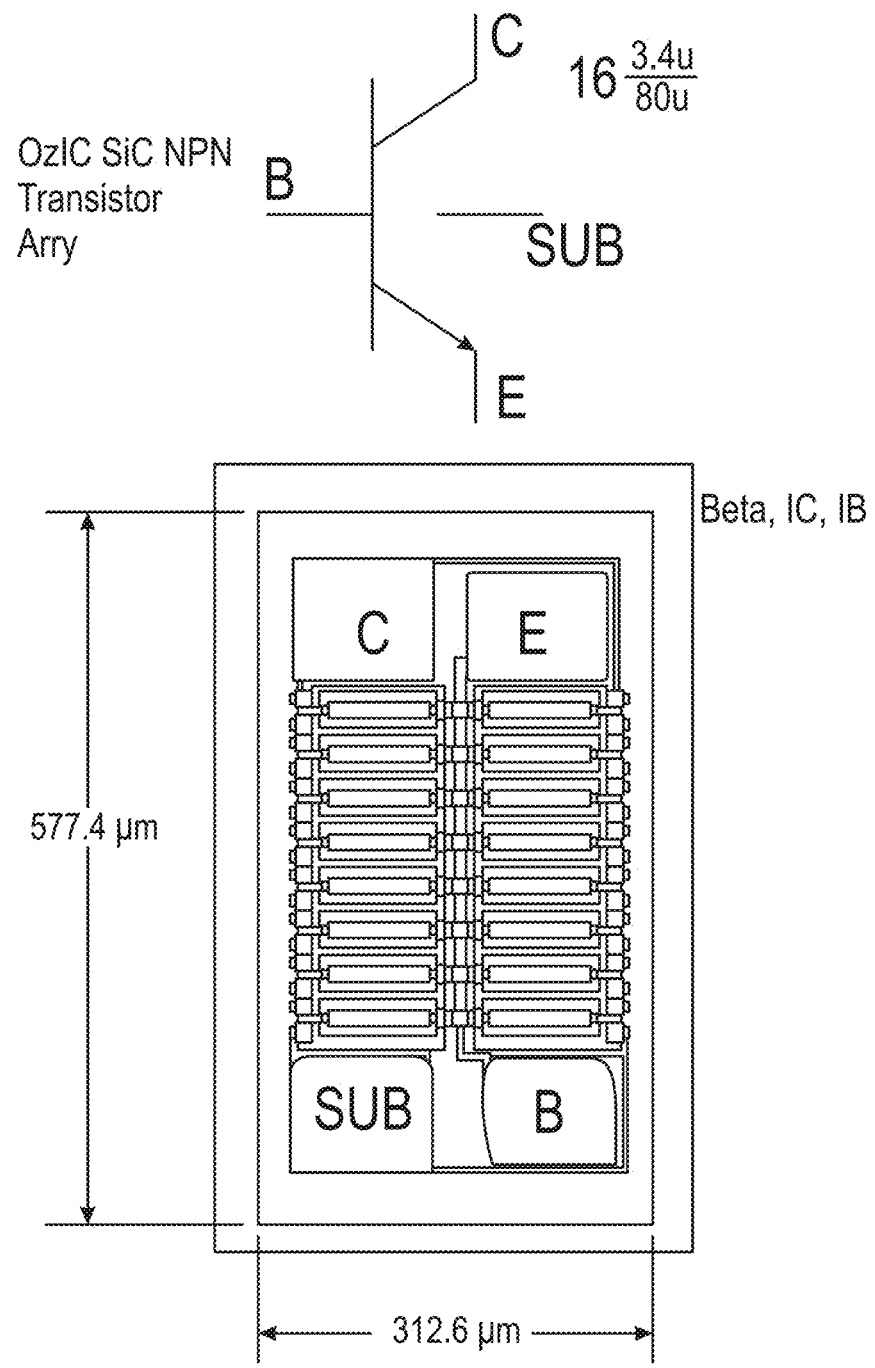
FIG. 3 shows the transistor array.
Figure 4:
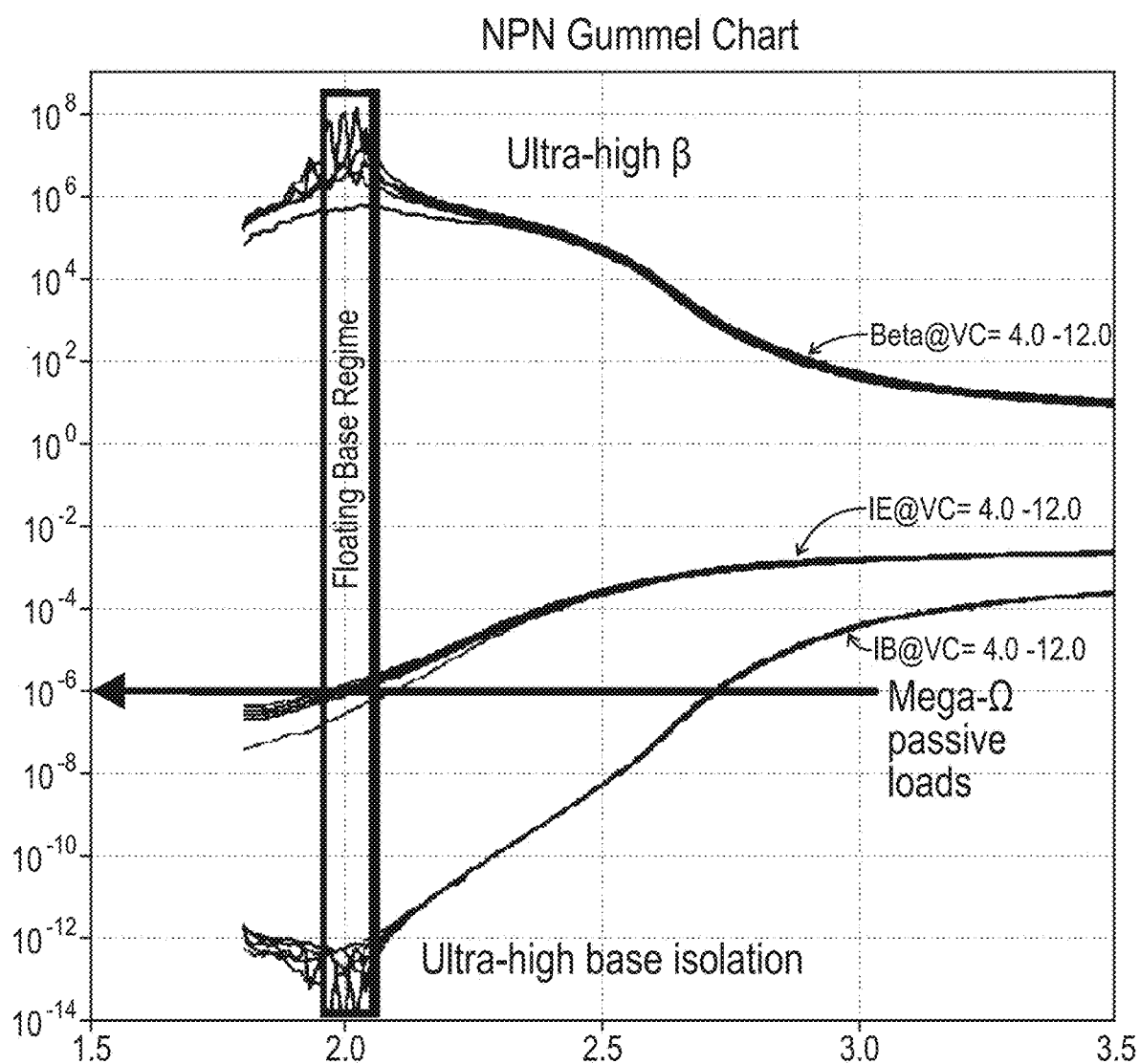
FIG. 4 shows the NPN Gummel Chart.
Figure 5:
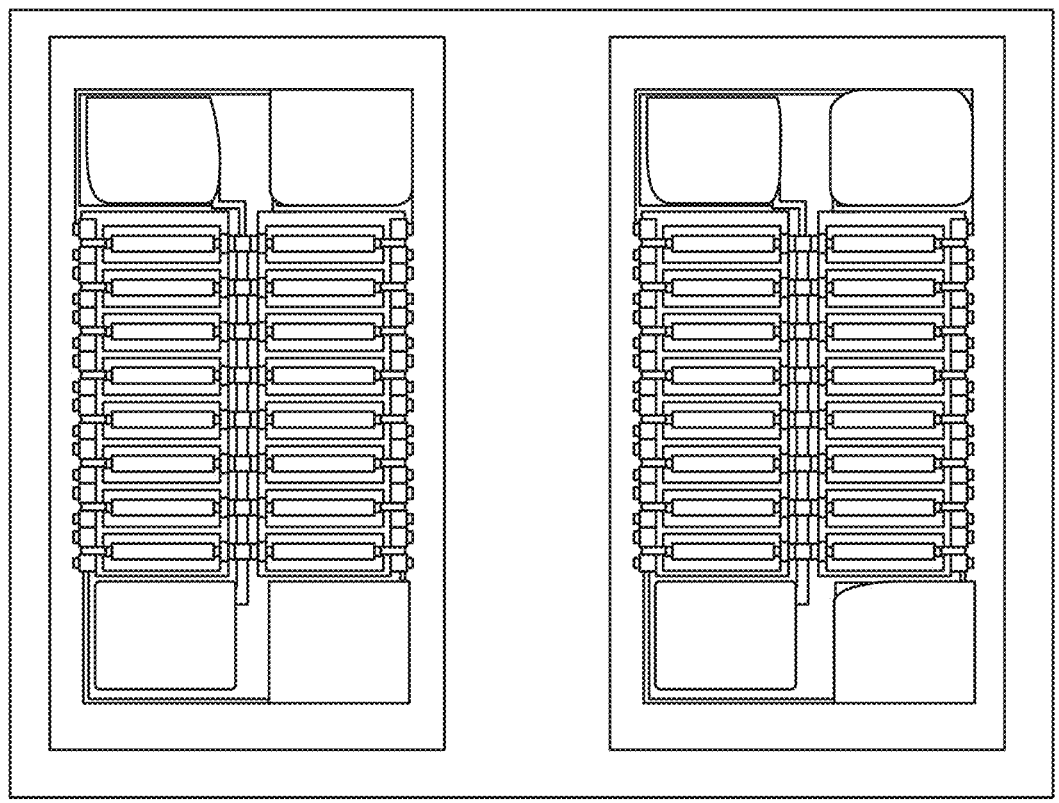
FIG. 5 shows a Dual SiC NPN-4T.
Figure 6:
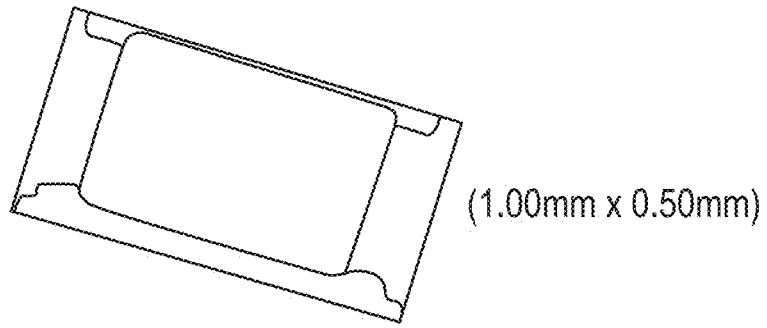
FIG. 6 shows a surface mount resistor
Figure 7:
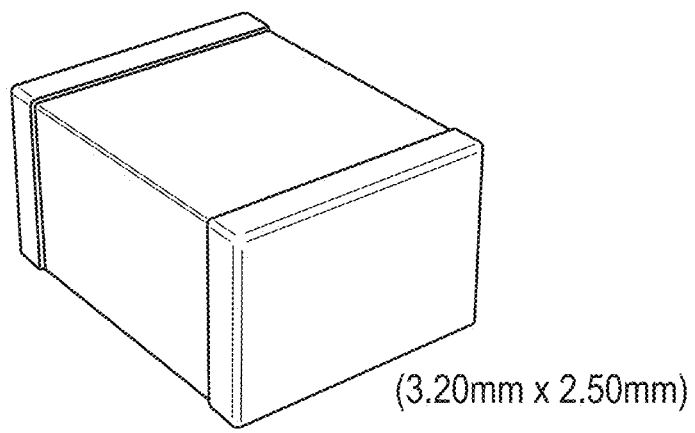
FIG. 7 shows a surface mount capacitor.
Figure 8:
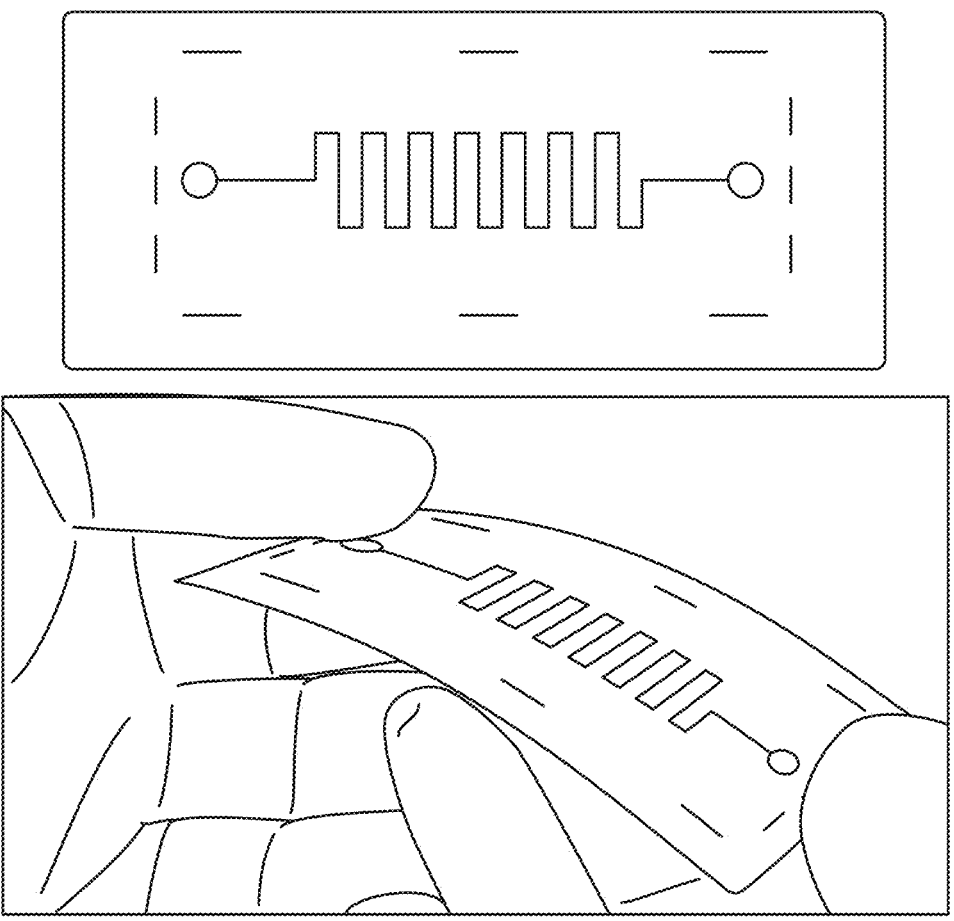
FIG. 8 shows a Flexible Alumina substrate.
Figure 9:
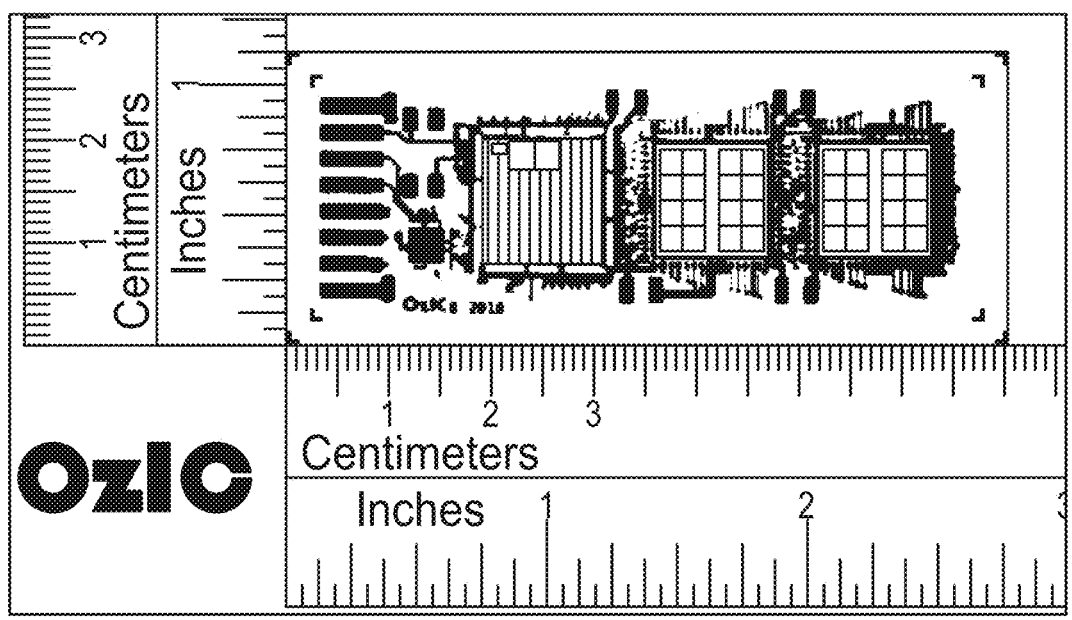
FIG. 9 shows a rigid ceramic substrate.

As shown in FIGS. 1-9 of the drawings, one exemplary embodiment of the present invention is generally shown as a monolithic substrate differential pair thermocouple amplifier 100. The monolithic substrate differential pair thermocouple amplifier 100 uses inputs of direct current power 10 and direct current ground 20 and a temperature differential across a thermocouple 300 to provide an amplified output signal 110 across an output pair 120 with positive output terminal 122 and minus output terminal 124.

Beginning at the bottom of FIG. 1, a hot mounting substrate 200 is provided and the thermocouple hot junction 310 is mounted onto hot mounting substrate 200 and provides a signal across the hot junction minus output 312 and hot junction positive output 314 to the thermocouple cold junction 320. The thermocouple cold junction 320 provides an output across cold junction minus output 322 and cold junction positive output 324. The thermocouple cold junction 320 is mounted on a ceramic isolation base 400 off of the hot mounting substate 200.

The thermocouple cold junction 320 includes a cold junction minus output 322 and cold junction positive output 324. The cold junction minus output 322 is electrically connected to the first base 710 of the first silicon carbide negative positive negative transistor 700. Cold junction positive output 324 is electrically connected to the second base 760 of the second SiC NPN transistor 750.

As may be understood from FIG. 1, the first Silicon Carbide (SiC) negative positive negative (NPN) transistor 700 and second SiC NPN transistor 750 are made on a SiC silicon carbide monolithic substrate 500 separated from the hot mounting substrate 200 by the ceramic isolation base 400.

The direct current power 10 and direct current ground 20 are provided onto the ceramic isolation base 400. An input capacitor 12 is mounted on the ceramic isolation base 400 and is electrically connected across direct current power 10 and direct current ground 20.

The first collector 720 of the first SiC NPN transistor 700 is connected through a collector resistor 810 to direct current power 10. The first emitter 730 of the first SiC NPN transistor 700 is connected to direct current ground 20. A first base capacitor 600 is connected from the first base 710 of the first SiC NPN transistor 700 to direct current ground 20. The second collector 770 of the second SiC NPN transistor 750 is connected through a second collector resistor 820 to direct current power 10. The second emitter 780 of the second SiC NPN transistor 750 is connected to direct current ground 20. A second base capacitor 650 is connected from the second base 760 of second SiC NPN transistor 750 to direct current ground 20.

In this manner, two Silicon Carbide (SiC) negative positive negative (NPN) transistors 700, 750 are realized monolithically on a monolithic substrate 300 as a differential pair 680. This differential pair 680 is mounted on the same ceramic isolation substrate 400 as the thermocouple cold junction 320. Because the two transistors are mounted in thermal sensitive proximity to each other, the high thermal conductivity of the SiC substrate 500 keeps the transistors 700, 750 base-emitter junctions at nearly the same temperature. This means their kT/q sensitivities tract together, this can be referred to as their thermal voltage sensitivities track each other. The base connections 710, 760 are tied to the positive 324 and negative 322 terminals of a thermocouple cold junction 320. Since the gain of the transistors 700, 750 is so high, even very small thermal power (V and I) generated by the thermocouple 300 (at the hot junction 310) create differential base currents. The base currents are then amplified to the collector currents creating a differential voltage across the output load resistors. Using SiC allows the amplifier to operate at high temperature, reducing the cable length between the cold junction and the hot junctions, thereby improving noise immunity. So for example, we could have the amplifier and cold junction in a region of a jet engine that is 400 degrees C. and the hot junction in a region of a jet engine that is 800 degrees C. The cable is shorter than if the amplifier has to be operated at 25 degrees C.

REFERENCE NUMBERS direct current power 10
direct current ground 20
monolithic substrate differential pair thermocouple amplifier 100
  amplified output signal 110
  output pair 120
    positive output terminal 122
    minus output terminal 124
  hot mounting substrate 200
  thermocouple 300
    thermocouple hot junction 310
      hot junction minus output 312
      hot junction positive output 314
    thermocouple cold junction 320
      cold junction minus output 322
      cold junction positive output 324
  ceramic isolation base 400
  silicon carbide monolithic substrate 500
  first base capacitor 600
  second base capacitor 650
  differential pair 680
    first silicon carbide negative positive negative transistor 700
      first base 710
      first collector 720
      first emitter 730
    second silicon carbide negative positive negative transistor 750
      second base 760
      second collector 770
      second emitter 780
  input capacitor 800
    first capacitor terminal 802
    second capacitor terminal 804
  first collector resistor 810
  second collector resistor 820

From the foregoing, it will be seen that this invention well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. A monolithic substrate differential pair the amplifier apparatus for use with a thermocouple including a thermocouple hot junction with a hot junction minus output and a hot junction positive output, and a thermocouple cold junction with a cold junction minus output and a cold junction positive output, comprising:

a first mounting substrate;

the thermocouple hot junction mounted on the first mounting substrate;

a ceramic isolation base mounted to the first mounting substrate;

the thermocouple cold junction mounted to the ceramic isolation base;

a silicon carbide monolithic substrate mounted to the ceramic isolation base; and a differential pair circuit with a first silicon carbide negative positive negative transistor and a second silicon carbide negative positive negative transistor mounted in thermal sensitive proximity on the monolithic substrate.

2. The apparatus of claim 1, the differential pair circuit further comprising:
   direct current power connection and a direct current ground connection on the ceramic isolation base.

3. The apparatus of claim 2, the differential pair circuit further comprising:
   the first silicon carbide negative positive negative transistor including a first base, a first collector, and a first emitter;
   the second silicon carbide negative positive negative transistor including a second base, a second collector, and a second emitter.

4. The apparatus of claim 3, the differential pair circuit further comprising:
   the first collector connected to a first collector resistor to direct current power; and
   the second collector connected to a second collector resistor to direct current power.

5. The apparatus of claim 3, the differential pair circuit further comprising:
   the first emitter connected to direct current ground; and
   the second emitter connected to direct current ground.

6. The apparatus of claim 3, the differential pair circuit further comprising:
   a first base capacitor connected from the first base to direct current ground.

7. The apparatus of claim 6, the differential pair circuit further comprising:
   a second base capacitor connected from the second base to direct current ground.

8. The apparatus of claim 3, the differential pair circuit further comprising:
   an input capacitor connected between direct current power and direct current ground.

* * * * *